US012771297B2

(12) United States Patent
Marbell et al.

(10) Patent No.: US 12,771,297 B2
(45) Date of Patent: Oct. 20, 2026

(54) DOHERTY AMPLIFIER WITH ISOLATION STRUCTURE

(71) Applicant: MACOM Technology Solutions Holdings, Inc., Lowell, MA (US)

(72) Inventors: Marvin Marbell, Cary, NC (US); Jeremy Fisher, Raleigh, NC (US); Haedong Jang, San Jose, CA (US); William Pribble, Durham, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 481 days.

(21) Appl. No.: 18/469,064

(22) Filed: Sep. 18, 2023

(65) Prior Publication Data

US 2025/0096733 A1 Mar. 20, 2025

(51) Int. Cl.
*H03F 1/02* (2006.01)
*H03F 3/60* (2006.01)

(52) U.S. Cl.
CPC .......... *H03F 1/0288* (2013.01); *H03F 3/602* (2013.01); *H03F 2200/451* (2013.01)

(58) Field of Classification Search
CPC ... H03F 1/0288; H03F 3/602; H03F 2200/451
USPC .......................................... 330/124 R, 291
See application file for complete search history.

(56) References Cited

U.S. PATENT DOCUMENTS

| | | | |
|---|---|---|---|
| 4,946,547 | A | 8/1990 | Palmour et al. |
| 5,192,987 | A | 3/1993 | Khan et al. |
| 5,200,022 | A | 4/1993 | Kong et al. |
| 5,210,051 | A | 5/1993 | Carter, Jr. |
| 5,296,395 | A | 3/1994 | Khan et al. |
| RE34,861 | E | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter, Jr. et al. |
| 6,316,793 | B1 | 11/2001 | Sheppard et al. |
| 6,548,333 | B2 | 4/2003 | Smith |
| 7,030,428 | B2 | 4/2006 | Saxler |
| 7,045,404 | B2 | 5/2006 | Sheppard et al. |
| 7,544,963 | B2 | 6/2009 | Saxler |
| 7,548,112 | B2 | 6/2009 | Sheppard |
| 7,592,211 | B2 | 9/2009 | Sheppard et al. |

(Continued)

FOREIGN PATENT DOCUMENTS

WO 2009027916 A2 3/2009

OTHER PUBLICATIONS

M. Ahmed et al., “2.6-GHz Integrated LDMOS Doherty Power Amplifier for 5G Basestation Applications,” in IEEE Microwave and Wireless Components Letters, vol. 31, No. 7, Jul. 2021, pp. 881-884.

*Primary Examiner* — Hafizur Rahman
(74) *Attorney, Agent, or Firm* — Sage Patent Group

(57) ABSTRACT

A Doherty amplifier die according to some embodiments includes a substrate having a bandgap of above about 2 eV, a main amplifier, at least one peak amplifier, an input network connected to a first input of the main amplifier and to a second input of the at least one peak amplifier, an output combiner connected to a first output of the main amplifier and to a second output of the at least one peak amplifier; and an isolation structure arranged on the substrate between the input network and the output combiner. The isolation structure is configured to isolate the input network and the output combiner.

25 Claims, 13 Drawing Sheets

(56) References Cited

U.S. PATENT DOCUMENTS

| | | | | |
|---|---|---|---|---|
| 7,615,774 | B2 | 11/2009 | Saxler | |
| 7,709,269 | B2 | 5/2010 | Smith et al. | |
| 8,049,252 | B2 | 11/2011 | Smith et al. | |
| 8,120,064 | B2 | 2/2012 | Parikh et al. | |
| 12,224,713 | B2 * | 2/2025 | van der Heijden | H03F 1/0288 |
| 12,506,446 | B2 * | 12/2025 | Tucker | H03F 1/301 |
| 12,519,426 | B2 * | 1/2026 | Ladhani | H03F 1/0288 |
| 2013/0154731 | A1 * | 6/2013 | Gajadharsing | H03F 1/0294 330/124 R |
| 2016/0043039 | A1 * | 2/2016 | Lakshminarayan | H10W 42/20 257/659 |
| 2021/0408979 | A1 * | 12/2021 | Komposch | H03F 3/195 |
| 2022/0021343 | A1 * | 1/2022 | Hue | H03F 3/21 |
| 2022/0037464 | A1 * | 2/2022 | Zhao | H10D 62/113 |
| 2022/0271715 | A1 * | 8/2022 | Geng | H03F 1/0288 |
| 2023/0283240 | A1 * | 9/2023 | Zhao | H03F 3/211 330/295 |

* cited by examiner

DOHERTY AMPLIFIER WITH ISOLATION STRUCTURE

FIELD

The disclosure relates to Doherty amplifiers with an isolation structure arranged on a substrate between an input network and an output combiner, and the isolation structure is configured to isolate the input network and the output combiner.

BACKGROUND

Electrical circuits requiring high power handling capability while operating at high frequencies, such as R-band (0.5-1 GHZ), S-band (3 GHZ), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity and handle high output power levels.

RF amplifiers are widely used in cellular communications systems and other applications. RF amplifiers are typically formed as semiconductor integrated circuit chips. Most RF amplifiers are implemented in silicon or using wide bandgap semiconductor materials, such as silicon carbide ("SiC") and Group Ill nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as GaN-based compounds AlGaN and AlInGaN. These compounds have empirical formulas in which one mole of nitrogen is combined with a total of one mole of the Group III elements.

Silicon-based RF amplifiers are typically implemented using laterally diffused metal oxide semiconductor ("LDMOS") transistors. Silicon LDMOS RF amplifiers can exhibit high levels of linearity and may be relatively inexpensive to fabricate. Group Ill nitride-based RF amplifiers are typically implemented using High Electron Mobility Transistors ("HEMT") and are primarily used in applications requiring high power and/or high frequency operation where LDMOS transistor amplifiers may have inherent performance limitations.

RF amplifiers may include one or more amplification stages, with each stage typically implemented as a transistor amplifier. In order to increase the output power and current handling capabilities, RF amplifiers are typically implemented in a "unit cell" configuration in which a large number of individual "unit cell" transistors are arranged electrically in parallel. The RF amplifier may be implemented as a single integrated circuit chip or "die," or may include a plurality of dies. When multiple RF amplifier die are used, they may be connected in series and/or in parallel.

RF amplifiers often include matching circuits, such as impedance matching circuits, that are designed to improve the impedance match between an RF amplifier die and transmission lines connected thereto for RF signals at the fundamental operating frequency and harmonic termination circuits that are designed to at least partly terminate harmonics that may be generated during device operation such as second and third order harmonics. The RF amplifier die(s) as well as the impedance matching and harmonic termination circuits may be enclosed in a package. Electrical leads may extend from the package that are used to electrically connect the RF amplifier to external circuit elements such as input and output RF transmission lines and bias voltage sources.

As noted above, Group III nitride-based RF amplifiers are often used in high power and/or high frequency applications. Typically, high levels of heat are generated within the Group III nitride-based RF amplifier die(s) during operation. If the RF die(s) become too hot, the performance (e.g., output power, efficiency, linearity, gain, etc.) of the RF amplifier may deteriorate and/or the RF amplifier die(s) may be damaged. As such, Group III nitride-based RF amplifiers are typically mounted in packages that may be optimized for heat removal.

FIG. 1 is a schematic top view of a wafer 100 from which multiple GaN based HEMT Doherty amplifier die 102 (formed on a silicon carbide substrate) will be singulated. Typically, GaN based HEMT Doherty amplifier dies 102*a*, 102*b* are separated using a saw (not shown) to cut the die 102 along streets 104. Because they are adjacent dies 102 on the same wafer 100, the transistors can have matching characteristics, such as a matching threshold voltage. However, once the dies 102 are sawn, there is no guarantee in the assembly process that these two singulated dies 102 will be used in the same multi-transistor amplifier. In the case of asymmetrical amplifiers, such as an asymmetrical Doherty amplifier, the main and peaking transistors can come from different wafers. Without additional testing, matching the characteristics of the singulated dies 102 can be time intensive and cost ineffective.

To ensure that the main and peaking transistors have matching characteristics, transistors that are grown adjacent to each other on a wafer can be maintained together on a single die. As shown in FIG. 1, an example respective Doherty amplifiers 102*a*, 102*b* include a main GaN based HEMT 106*a*, 106*b* and a peak GaN based HEMT 108*a*, 108*b* formed as a single monolithic die 102*a*, 102*b*. Since the transistors 106, 108 are on the same die 102, together with their associated input and output matching networks, there is an increased potential for the input side and the output side of the transistors to interfere with each other.

SUMMARY

Embodiments of the present disclosure generally relate to Doherty amplifiers with an isolation structure arranged on a substrate between an input network and an output combiner, and the isolation structure is configured to isolate the input network and the output combiner.

In particular, one or more embodiments include a Doherty amplifier die. The Doherty amplifier die includes a substrate having a bandgap of above about 2 eV; a main amplifier on the substrate; at least one peak amplifier on the substrate; an input network on the substrate connected to a first input of the main amplifier and to a second input of the at least one peak amplifier; and an output combiner on the substrate connected to a first output of the main amplifier and to a second output of the at least one peak amplifier. The Doherty amplifier die further includes an isolation structure arranged on the substrate between the input network and the output combiner, and the isolation structure is configured to isolate the input network and the output combiner.

The isolation structure can include a transmission line on the substrate.

In some embodiments, the isolation structure includes a continuous segment of a metal layer on the substrate.

In other embodiments, the isolation structure includes a discontinuous segment of a metal layer on the substrate.

In some embodiments, the isolation structure includes a U-shaped metal isolation structure on the substrate.

In some embodiments, the isolation structure includes an upper surface and a lower surface, and the Doherty amplifier die further includes a first via connected between a first portion of the lower surface of the isolation structure and a source ground of the main amplifier; and a second via connected between a second portion of the lower surface of the isolation structure and a source ground of the at least one peak amplifier.

In some embodiments, the Doherty amplifier die further includes a plurality of additional vias between the first via and the second via. Respective vias are spaced apart and connected between a plurality of additional portions of the lower surface of the isolation structure and a ground structure connected to the source ground of the main and peak amplifiers.

In some embodiments, the isolation structure includes an upper surface and a lower surface, and the Doherty amplifier die further includes a via connected along a length of the lower surface of the isolation structure and a source ground of the main amplifier and the peak amplifier.

In some embodiments, the input network includes a main input match network for the main amplifier and a peak input match network for the peak amplifier, and an input combiner.

In some embodiments, the main and the at least one peak amplifiers are GaN-based HEMTs.

In some embodiments, the main and the at least one peak amplifiers are LDMOS transistors.

One or more other embodiments include a Doherty amplifier die including a substrate having a bandgap of above about 2 eV; a main amplifier on the substrate; at least one peak amplifier on the substrate; an input network on the substrate including (i) an input match network and (ii) an input combiner including a plurality of components. The input network is connected to a first input of the main amplifier and to a second input of the at least one peak amplifier. The Doherty amplifier die further includes an output combiner on the substrate connected to a first output of the main amplifier and to a second output of the at least one peak amplifier. The Doherty amplifier die further includes an isolation structure arranged on the substrate between the input network and the output combiner, and the isolation structure is configured to isolate the input network and the output combiner.

In some embodiments, the isolation structure includes a transmission line on the substrate.

In some embodiments, the isolation structure includes a continuous segment of a metal layer of the substrate.

In some embodiments, the isolation structure includes a discontinuous segment of a metal layer on the substrate.

In some embodiments, the isolation structure includes a U-shaped metal isolation structure on the substrate.

In some embodiments, the isolation structure includes an upper surface and a lower surface, and the Doherty amplifier die further includes a first via connected between a first portion of the lower surface of the isolation structure and a source ground of the main amplifier; and a second via connected between a second portion of the lower surface of the isolation structure and a source ground of the at least one peak amplifier.

In some embodiments, the Doherty amplifier further includes a plurality of additional vias between the first via and the second via. Respective vias are spaced apart and connected between a plurality of additional portions of the lower surface of the isolation structure and a ground structure connected to the source ground of the main and peak amplifiers.

In some embodiments, the isolation structure includes an upper surface and a lower surface, and the Doherty amplifier die further includes a via connected along the length of the lower surface of the isolation structure and a source ground of the main amplifier and the peak amplifier.

In some embodiments, the plurality of components of the input combiner include a first shunt capacitor, a series capacitor, a series inductor, and a second shunt capacitor.

In some embodiments, the plurality of components of the input combiner include a first shunt capacitor, a first series capacitor, a first series inductor, a second shunt capacitor, and a second series inductor.

In some embodiments, the plurality of components of the input combiner include a first shunt capacitor, a first series inductor, a second series capacitor, a second series inductor, and a second shunt capacitor.

In some embodiments, the main and the at least one peak amplifiers are GaN-based HEMTs.

In some embodiments, the main and the at least one peak amplifiers are LDMOS transistors.

One or more other embodiments include a Doherty amplifier device. The Doherty amplifier device includes a substrate having a bandgap of above about 2 eV, the substrate having a first surface and a second surface; a main amplifier on the first surface of the substrate; at least one peak amplifier on the first surface of the substrate; an input network on the first surface of the substrate connected to a first input of the main amplifier and to a second input of the at least one peak amplifier; and an output combiner on the first surface of the substrate connected to a first output of the main amplifier and to a second output of the at least one peak amplifier. The Doherty amplifier device further includes an isolation structure arranged on one or more conductive vias that extend into the first surface of the substrate between the input network and the output combiner. The isolation structure is configured to isolate the input network and the output combiner. The Doherty amplifier device further includes a printed circuit board; and one or more conductive pillar structures that protrude from the first surface of the substrate and are electrically connected to the one or more conductive vias and the printed circuit board.

Figure 1:
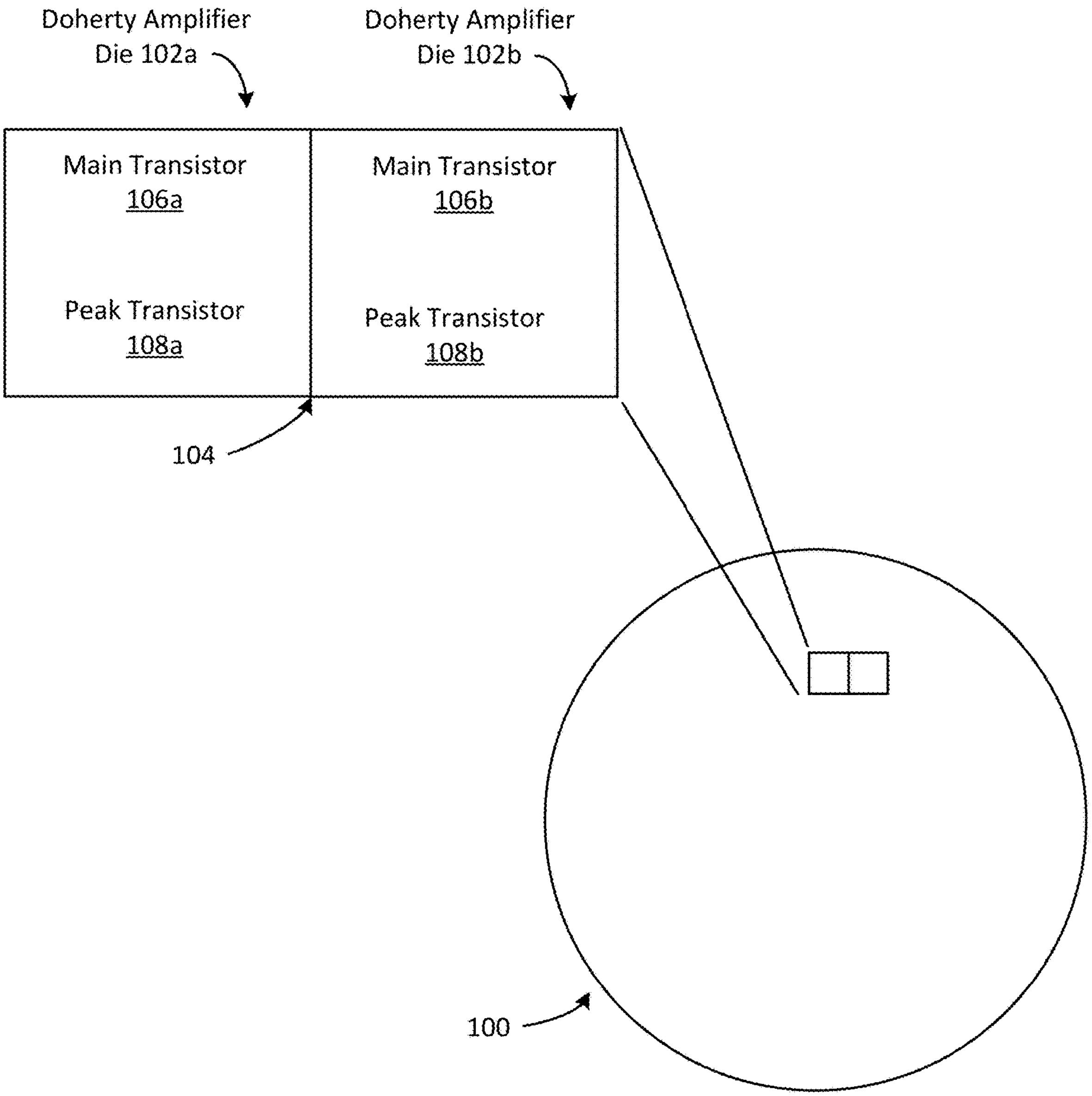
FIG. 1 is a schematic top view of a conventional wafer with multiple singulated Doherty amplifier dies.

Additional features, advantages, and aspects of the disclosure may be set forth or apparent from consideration of the following detailed description, drawings, and claims. Moreover, it is to be understood that both the foregoing summary of the disclosure and the following detailed description includes examples and intended to provide further explanation without limiting the scope of the disclosure as claimed.

DETAILED DESCRIPTION

Embodiments of the inventive concepts are explained more fully with reference to the non-limiting aspects and examples that are described and/or illustrated in the accompanying drawings and detailed in the following description. It should be noted that the features illustrated in the drawings are not necessarily drawn to scale, and features of some embodiments may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Certain embodiments can be utilized in the die structure described in FIG. 1. However, other embodiments are possible. For example, different packaging structures can be used as discussed further herein.

Figure 2:
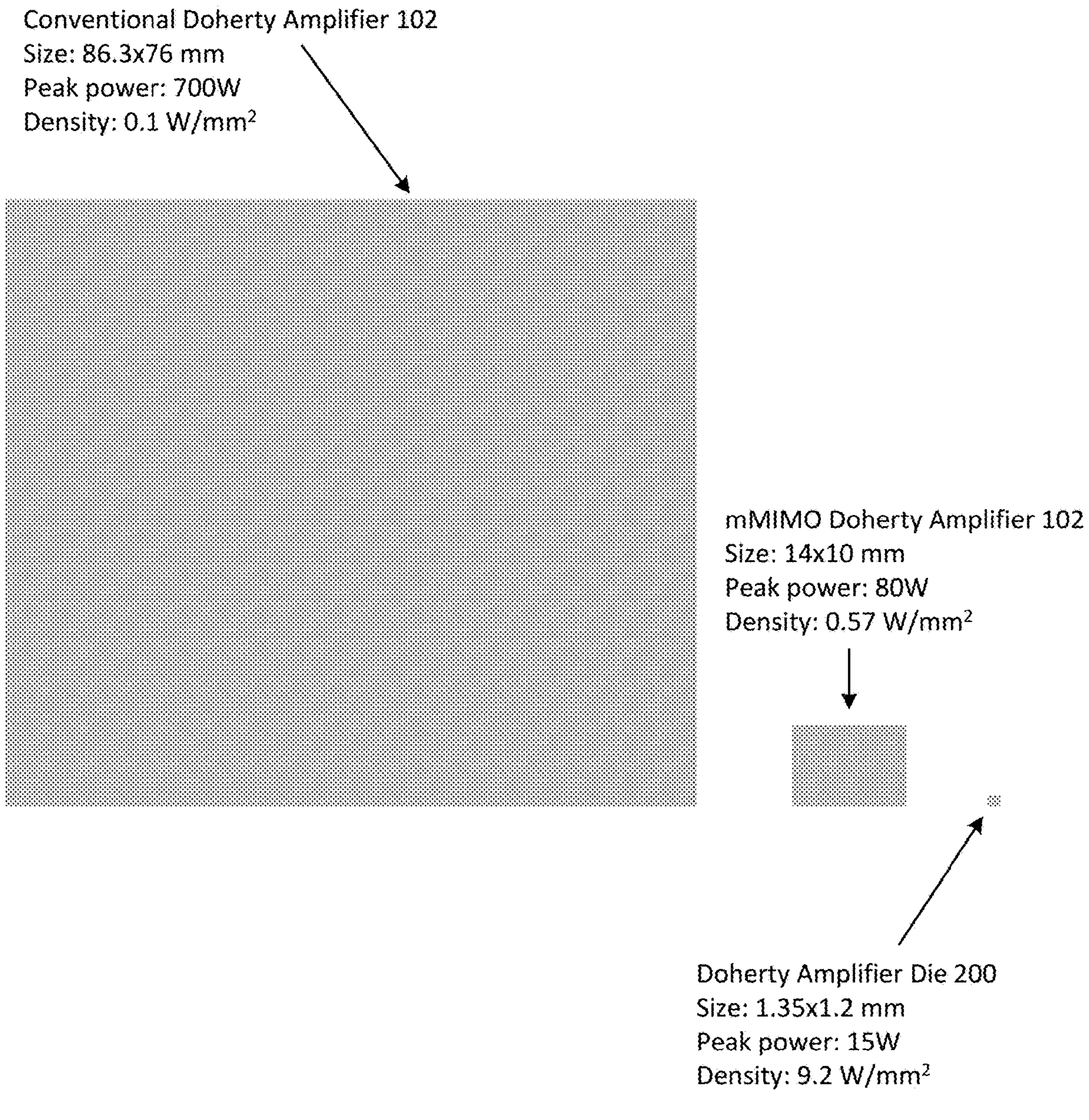
FIG. 2 includes schematic top views of the area occupied by a conventional power Doherty amplifier circuit board, a conventional massive multiple-input multiple-output (mMIMO) Doherty amplifier, and a Doherty amplifier die in accordance with some embodiments of the present disclosure, respectively.

In conventional Doherty amplifiers, the input components and output components of the Doherty amplifier may be separated by a sufficient enough distance so as to avoid input-output radio frequency (RF) coupling that can cause instability and performance degradation. For example, FIG. 2 includes schematic top views of examples of (i) a conventional power Doherty amplifier circuit board 102 having a size of 86.3 mm×76 mm; a peak power of 700 W; and a power to combined Doherty area density of 0.1 W/mm$^2$; and (ii) a conventional mMIMO Doherty amplifier 102 having a size of 14 mm×10 mm; a peak power of 80 W; and a power to combined Doherty area density of 0.57 W/mm$^2$.

As discussed further herein, Doherty amplifiers 200 of the present disclosure include an isolation structure arranged with input and output components of the Doherty amplifier 200 to avoid or lessen input-output RF coupling in a compact (e.g., minimum-sized) Doherty amplifier die 200 compared to conventional Doherty amplifiers (e.g., Doherty amplifiers 102) while having acceptable stability and performance. For example, Doherty amplifier die 200 has a size of 1.35 mm×1.2 mm; a peak power of 15 W; and a power to combined Doherty area density of 9.2 W/mm$^2$.

The term "isolate" herein refers to block or reduce radio frequency (RF) coupling between the input network and the output combiner.

Further, the configuration of embodiments herein allows a Doherty amplifier to be designed on-chip (including input and output Doherty combining and matching (e.g., matching to 50 ohms) in a significantly smaller footprint than conventional Doherty amplifiers for a comparable power/frequency.

Figure 3:
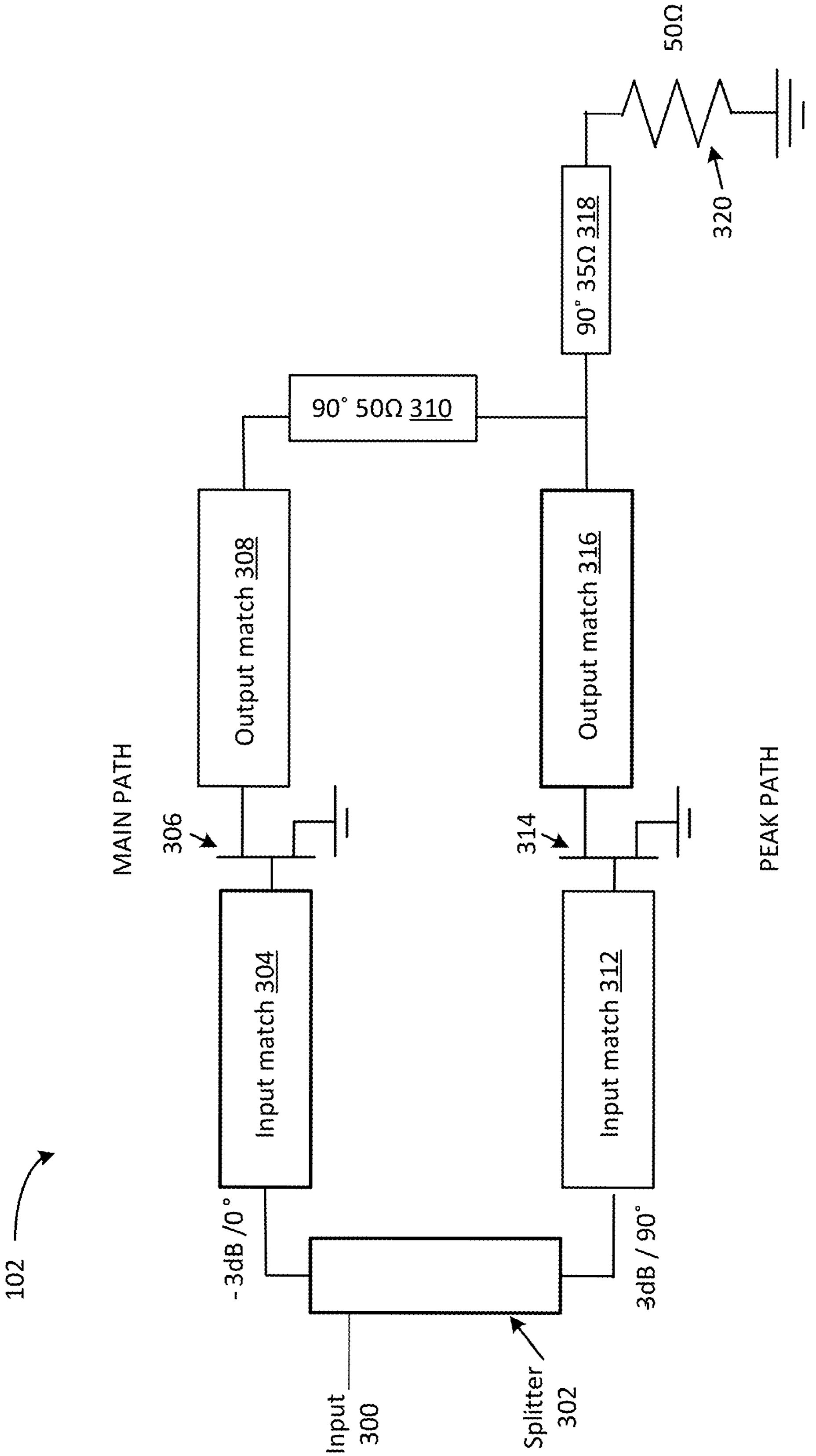
FIG. 3 is a schematic diagram illustrating a top view of a conventional Doherty amplifier die.

FIG. 3 is schematic top view of a conventional Doherty amplifier die 102. Doherty amplifier die 102 includes two amplifier devices 306, 314 (e.g., GaN-based HEMTs) that operate in main and peak power paths, respectively. As illustrated in FIG. 3, a modulated RF input signal 300 is fed to a power splitter 302, which splits the RF input signal 300 along a main path and a peak path. In this example, the RF input signal 300 is split evenly such that the main path and the peak path receive one-half (−3 dB) of the original input power of the RF input signal 300.

The main path in this example includes a main input match network 304, main transistor 306, and a main output match network 308. The peak path includes a peak input match network 312, peak transistor 314, and a peak output match network 316. The output of the main output match network 308 and the output of the peak output match network 316 are coupled to an output power combining network that includes an impedance inverters 310, 318 and output load 320.

Figure 4:
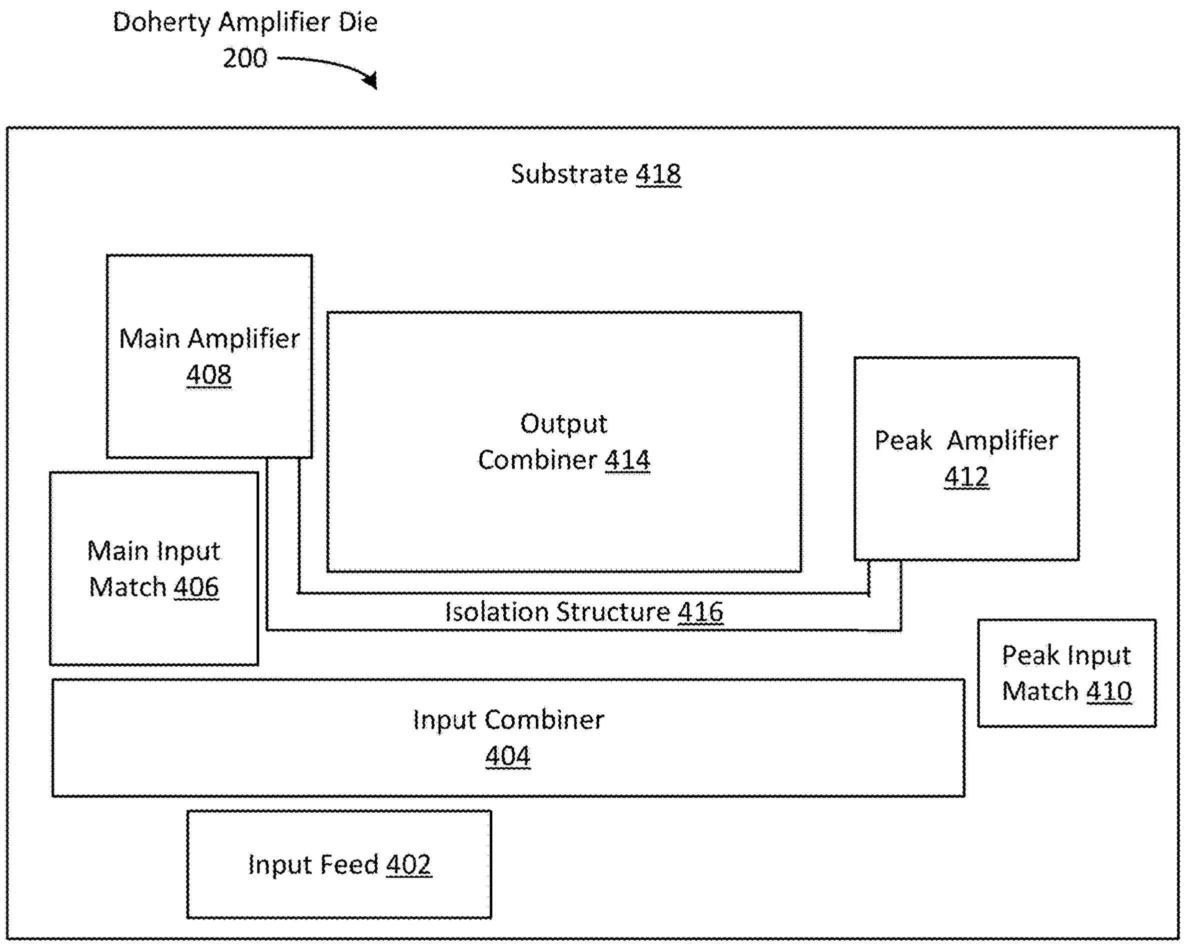
FIG. 4 is a schematic diagram illustrating a top view of a Doherty amplifier die in accordance with some embodiments of the present disclosure.

FIG. 4 is schematic circuit diagram of an example Doherty amplifier die 200 of the present disclosure. Doherty amplifier die 200 is on substrate 418 having a bandgap above about 2 eV and includes two amplifier devices: main amplifier 408 and peak amplifier 412 (e.g., GaN-based HEMTs). As illustrated in FIG. 4, an isolation structure 416 is arranged on the substrate 418 between an input network and the output combiner 414. The input network in this example includes input feed 402, input combiner 404, main input match 406, and peak input match 410. While the example in FIG. 4 includes one peak amplifier 412, the present disclosure is not so limited and other embodiments include a plurality of peak amplifiers 412.

The isolation structure 416 is this example is configured to block or substantially block RF coupling from the output combiner 414 and the input network 402, 404, 406, 410.

Figure 5A:
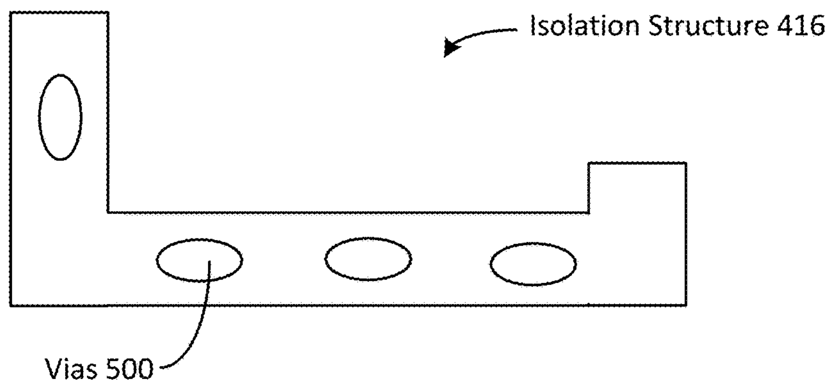
FIG. 5A is a schematic top view illustrating an example isolation structure in accordance with some embodiments of the present disclosure.
Figure 5B:
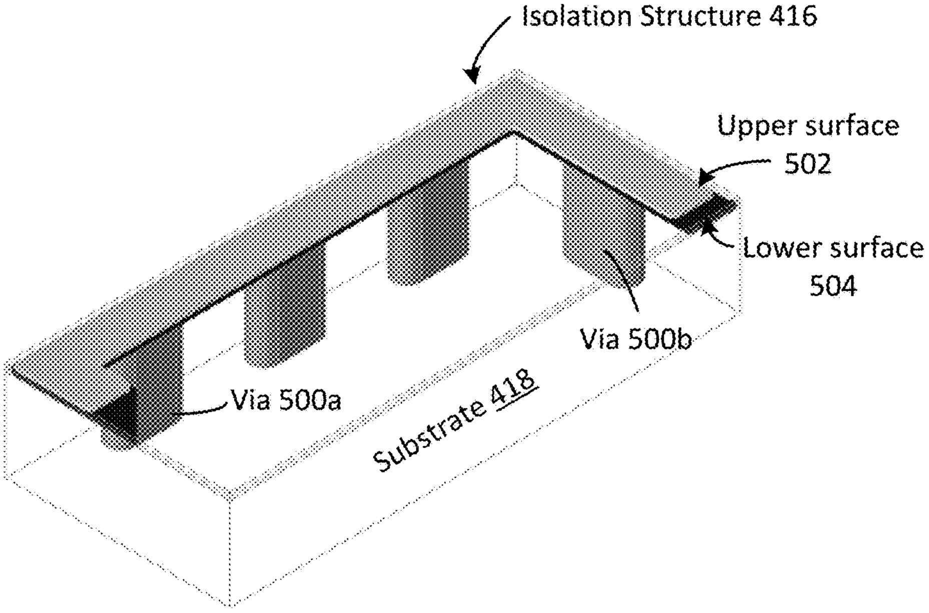
FIG. 5B is a schematic three-dimensional view illustrating an example isolation structure in accordance with some embodiments of the present disclosure.

FIG. 5A is schematic top view illustrating an example isolation structure 416 in accordance with some embodiments of the present disclosure; and FIG. 5B is a schematic diagram of a three-dimensional view of the example isolation structure 416 of FIG. 5A. As shown, the isolation structure 416 can include an upper surface 502, a lower surface 504, and vias 500. The vias 500 can include a first via 500*a* connected between a first portion of the lower surface 504 of the isolation structure 416 and a source ground of the main amplifier 408; and a second via 500*b* connected between a second portion of the lower surface 504 of the isolation structure 416 and a source ground of the at least one peak amplifier 412.

As further shown in FIG. 5A, the isolation structure 416 can include a plurality of additional vias 500 between the first via 500*a* and the second via 500*b*. Respective vias 500 are spaced apart and connected between a plurality of additional portions of the lower surface 504 of the isolation structure 416 and a ground structure connected to the ground of the main and peak amplifiers in order to separate the input network 402, 404, 406, 410 and the output combiner 414.

Figure 5C:
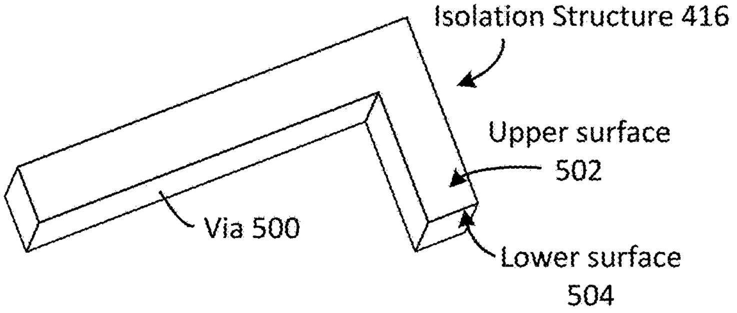
FIG. 5C is a schematic three-dimensional view illustrating another example isolation structure in accordance with some embodiments of the present disclosure.

FIG. 5C is a schematic diagram of three-dimensional view of another example isolation structure 416 that includes one via that is connected along a length of the lower surface 504 of the isolation structure 416 for connection to a ground structure of the main amplifier 408 and the peak amplifier 412. While the via 500 in FIG. 5C is shown as extending along the entire length of the lower surface 504 of the isolation structure 416, other configurations can be implemented such as one via along a portion of the lower surface 504.

Figure 5D:
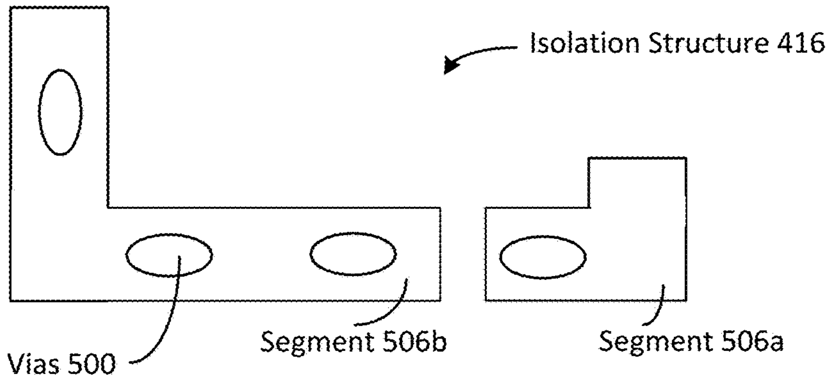
FIG. 5D is a schematic top view illustrating an example multiple segmented isolation structure in accordance with some embodiments of the present disclosure.
Figure 5E:
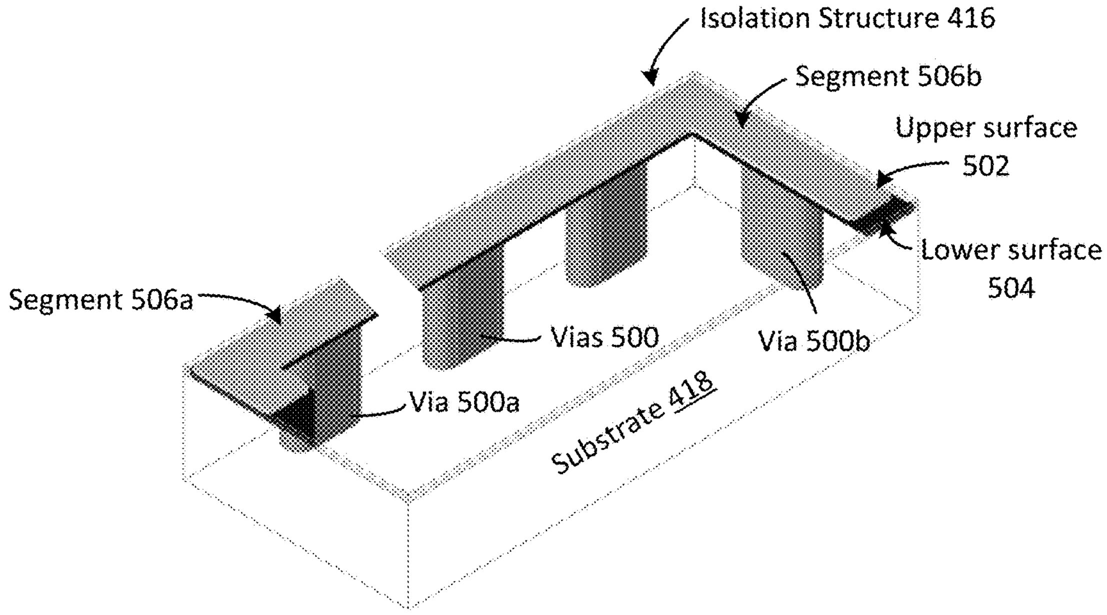
FIG. 5E is a schematic three-dimensional view illustrating the multiple segmented isolation structure of FIG. 5D in accordance with some embodiments of the present disclosure.

FIG. 5D is a schematic top view illustrating an example multiple segmented isolation structure 416 in accordance with some embodiments of the present disclosure; and FIG. 5E is a schematic three-dimensional view illustrating the example multiple segmented isolation structure 416 of FIG. 5D. As shown, the isolation structure 416 can include multiple segments 506*a*, 506*b*. Each segment 506*a*, 506*b* can include an upper surface 502, a lower surface 504, and via(s) 500. The vias 500 can include a first via 500*a* connected between a first portion of the lower surface 504 of the segment 506*a* of isolation structure 416 and a source ground of the main amplifier 408; and a second via 500*b* connected between a second portion of the lower surface 504 of the segment 506*b* of isolation structure 416 and a source ground of the at least one peak amplifier 412. In this example, isolation structure 416 includes two segments 506*a*, 506*b*. In other embodiments, however, the isolation structure 416 can include more than two segments 506.

As further shown in FIG. 5D, the isolation structure 416 can include a plurality of additional vias 500 between the first via 500*a* and the second via 500*b*. In this example, the additional vias 500 are included on the second segment 506*b*, but in other embodiments, additional vias can be on one or more segments of an isolation structure 416. Respective vias 500 are spaced apart and connected between a plurality of additional portions of the lower surface 504 of the isolation structure 416 and a ground structure connected to the ground of the main and peak amplifiers in order to separate the input network 402, 404, 406, 410 and the output combiner 414.

Figure 5F:
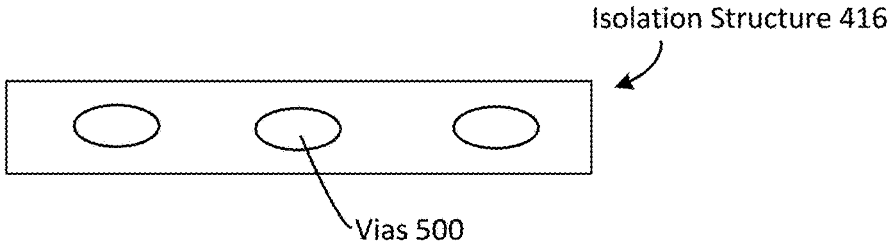
FIG. 5F is a schematic top view illustrating an example straight shaped isolation structure in accordance with some embodiments of the present disclosure.

FIG. 5F is a schematic top view illustrating an example straight shaped isolation structure that includes vias 500 connected along a length of the lower surface of the isolation structure 416 for connection to a ground structure of the main amplifier 408 and the peak amplifier 412. While the straight shape of this example is shown as a rectangle, the disclosure is not so limited and may include other straight shapes, such as a rounded rectangle, an ellipse, etc.

Vias 500 can be in various quantities and can have various shapes, sizes, and spacing between respective vias configured to form a wall or fence-like structure/barrier on the lower surface 504 of isolation structure 416 to block or reduce RF coupling between the input network 402, 404, 406, 410 and the output combiner 414. Thus, the via(s) 500 can be continuous or discontinuous vias 500 with spacing between respective vias 500. The spacing between two respective vias can be about 125 μm or another value within manufacturing capabilities, for example.

Vias 500 may be formed of a metal material, such as gold (Au) for example. The metal material of the vias 500 may be solid or plated.

In some embodiments, the isolation structure 416 is a transmission line on the substrate 418.

In some embodiments, the isolation structure 416 includes a continuous segment of a metal layer on substrate 418. In still other embodiments, the isolation structure 416 includes a discontinuous segment of a metal layer on substrate 418. In yet other embodiments, the isolation structure 416 includes a U-shaped metal isolation structure on the substrate 418, as illustrated in FIG. 4 for example.

Figure 6A:
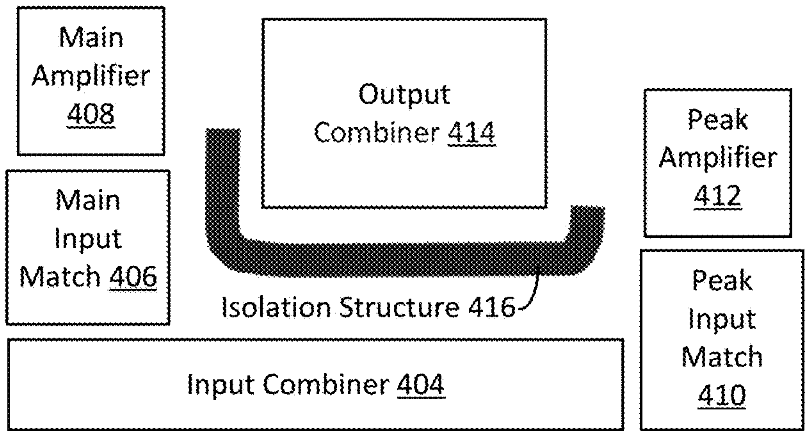
FIGS. 6A-6C are schematic top view diagrams illustrating example configurations of a Doherty amplifier die in accordance with some embodiments of the present disclosure.
Figure 6B:
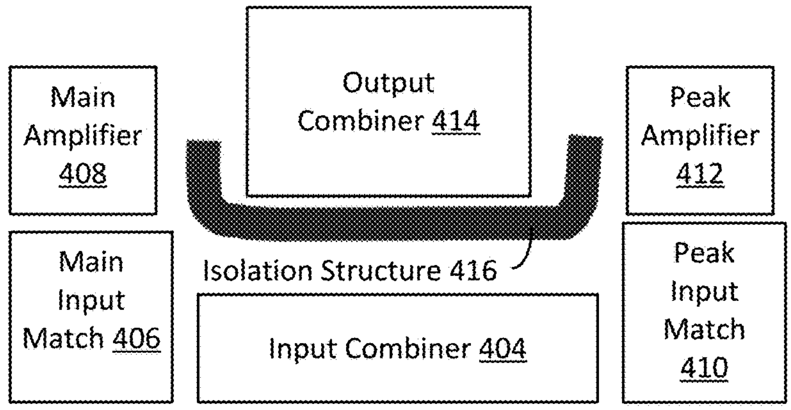
Figure 6C:
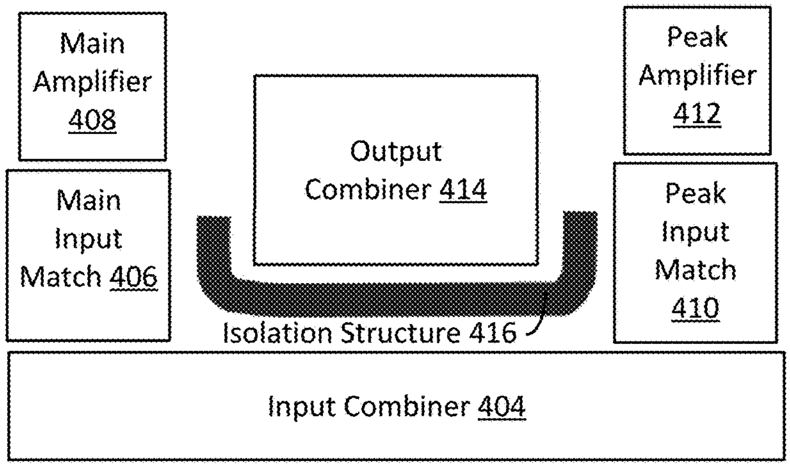

FIGS. 6A-6C are schematic top view diagrams illustrating other example layouts of Doherty amplifier die 200 in accordance with some embodiments of the present disclosure. As shown in the examples of FIGS. 6A-6C, the isolation structure 416 in each Figure has a different shape and orientation configured to provide isolation between input and output components of Doherty amplifier die 200. Isolation structure 416, however, is not limited to such shapes and orientations, and other shapes and orientations can be implemented in configurations to block or reduce RF coupling from the output combiner 414 and the input network 402, 404, 406, 410.

As shown in FIG. 6A, the input combiner 404 extends along the length of the main amplifier 408/main input match 406, and the output combiner 414; and is adjacent at least a portion of the peak input match 410. Isolation structure 416 has an asymmetrical U-shape and is positioned between a portion of the input combiner 404 and the output combiner 414, and between main input match 406 and peak input match 410.

In the next example shown in FIG. 6B, the input combiner 404 is between main input match 406 and peak input match 410. Isolation structure 416 has an approximate symmetrical U-shape and is positioned between the input combiner 404 and the output combiner 414, and between main input match 406 and peak input match 410.

In the example shown in FIG. 6C, the input combiner 404 extends along the length of the main amplifier 408/main input match 406, the output combiner 414, and the peak amplifier 412/peak input match 410. Isolation structure 416 has an approximate symmetrical U-shape and is positioned between the input combiner 404 and the output combiner 414, and between main input match 406 and peak input match 410.

The input combiner 404 can be a structure that includes different modular, segmented sections including a shunt capacitor(s), a series capacitor(s), and a series inductor(s).

Figure 7A:
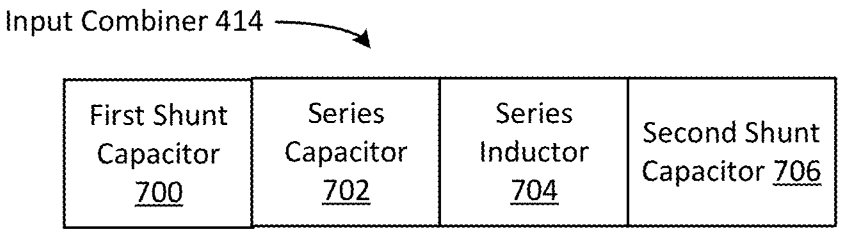
FIG. 7A is a schematic top view illustrating an example of an input combiner of a Doherty amplifier in accordance with some embodiments of the present disclosure.
Figure 7B:
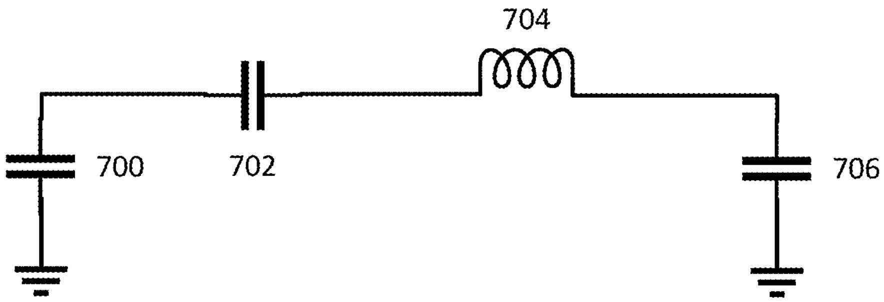
FIG. 7B is a schematic diagram illustrating an example circuit layout of the input combiner of FIG. 7A.

For example, FIG. 7A is a schematic top view illustrating a first example of an input combiner 404 of a Doherty amplifier 200 in accordance with some embodiments of the present disclosure; and FIG. 7B is a schematic diagram illustrating an example circuit layout of the input combiner 404 of FIG. 7A. As shown in this first example, input combiner 404 includes a first shunt capacitor 700, a series capacitor 702, a series inductor 704, and a second shunt capacitor 706.

Figure 7C:
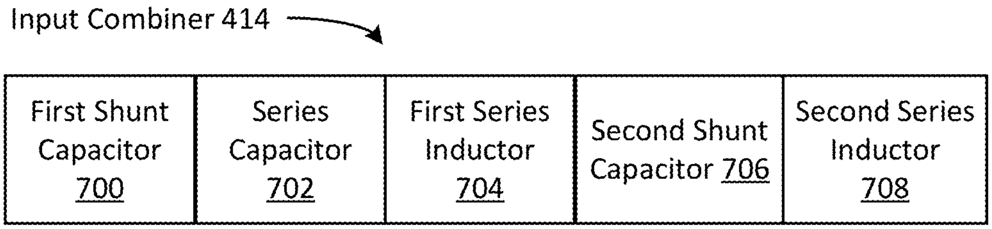
FIG. 7C is a schematic top view illustrating another example of an input combiner of a Doherty amplifier in accordance with some embodiments of the present disclosure.
Figure 7D:
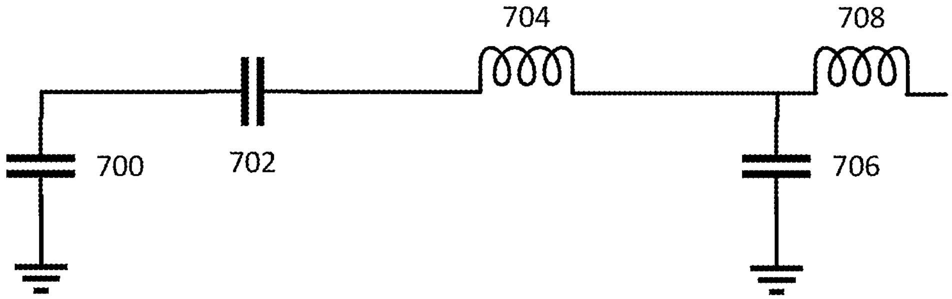
FIG. 7D is a schematic diagram illustrating an example circuit layout of the input combiner of FIG. 7C.

FIG. 7C is a schematic top view illustrating a second example of an input combiner 404 of a Doherty amplifier 200 in accordance with some embodiments of the present disclosure; and FIG. 7D is a schematic diagram illustrating an example circuit layout of the input combiner 404 of FIG. 7C. As shown in this second example, input combiner 404 includes a first shunt capacitor 700, a series capacitor 702, a first series inductor 704, a second shunt capacitor 706, and a second series inductor 708.

Figure 7E:
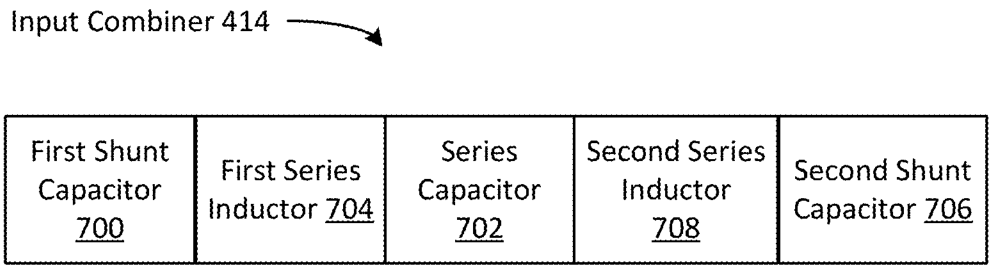
FIG. 7E is a schematic top view illustrating another example of an input combiner of a Doherty amplifier in accordance with some embodiments of the present disclosure.
Figure 7F:
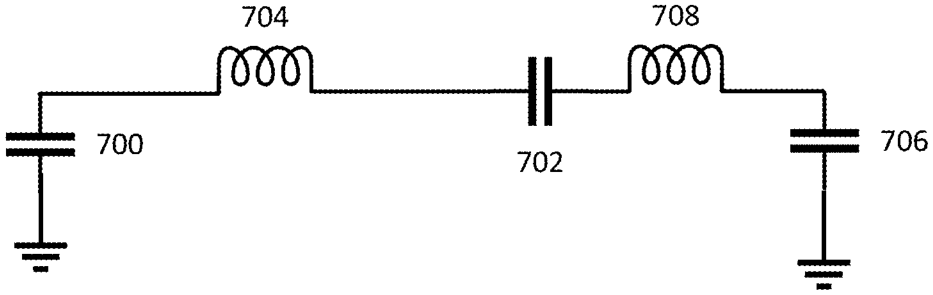
FIG. 7F is a schematic diagram illustrating an example circuit layout of the input combiner of FIG. 7E.

FIG. 7E is a schematic top view illustrating a third example of an input combiner 404 of a Doherty amplifier 200 in accordance with some embodiments of the present disclosure; and FIG. 7F is a schematic diagram illustrating an example circuit layout of the input combiner 404 of FIG. 7E. As shown in this third example, input combiner 404 includes a first shunt capacitor 700, a first series inductor 704, a series capacitor 702, a second series inductor 708, and a second shunt capacitor 706.

As a consequence of the input combiner 404 including modular, segmented sections, the input combiner 404 can be adjusted/re-designed for different frequencies, power levels, Doherty asymmetry, etc. for various configurations. For example, a low-impedance input combiner 404 can be implemented in a small form-factor to provide a correct phase difference from the main amplifier 408 to the peak amplifier 412 input by implementing some of the phase difference in series capacitors comprising metal-insulator-metal (MIM) capacitors.

The output combiner 414 can be a spiral chip inductor, for example. The output combiner 414 can use a 90 degree transmission line formed by the spiral inductor, for example, connected between output capacitances of the main amplifier 408 and the peak amplifier 412.

Some embodiments are directed to a Doherty amplifier die including a substrate having a bandgap of above about 2 eV; a main amplifier on the substrate; at least one peak amplifier on the substrate; an input network on the substrate including (i) an input match network and (ii) an input combiner including a plurality of components. The input network is connected to a first input of the main amplifier and to a second input of the at least one peak amplifier. The Doherty amplifier die further includes an output combiner on the substrate connected to a first output of the main amplifier and to a second output of the at least one peak amplifier; and an isolation structure arranged on the substrate between the input network and the output combiner. The isolation structure is configured to isolate the input network and the output combiner.

The plurality of components of the input combiner can include a first shunt capacitor, a series capacitor, a series inductor, and a second shunt capacitor.

In other embodiments, the plurality of components of the input combiner include a first shunt capacitor, a first series capacitor, a first series inductor, a second shunt capacitor, and a second series inductor.

In yet other embodiments, the plurality of components of the input combiner include a first shunt capacitor, a first series inductor, a second series capacitor, a second series inductor, and a second shunt capacitor.

Figure 8A:
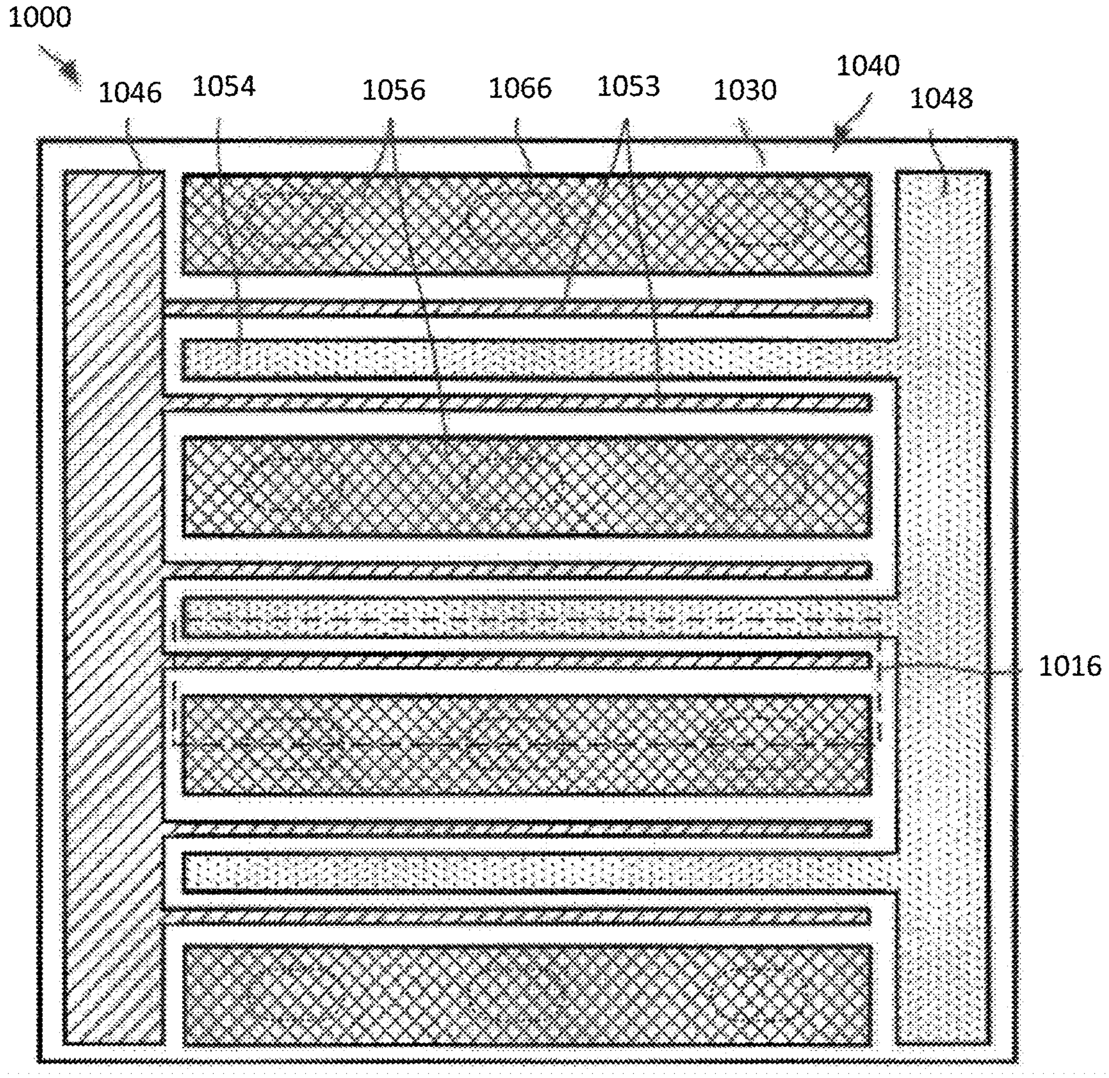
FIG. 8A is a schematic top view of an RF transistor amplifier die in accordance with some embodiments of the present disclosure.

FIG. 8A is a schematic top view of an RF transistor amplifier die 1000 that is taken through a portion of a top side metallization structure which is not shown to simplify the drawing.

As shown in FIG. 8A, the RF transistor amplifier die 1000 includes a Group III nitride-based HEMT amplifier that has a plurality of unit cell transistors 1016 that each include a gate finger 1052, a drain finger 1054 and a source finger 1056. The gate fingers 1052 are electrically connected to a common gate bus 1046, and the drain fingers 1054 are electrically connected to a common drain bus 1048. The gate bus 1046 is electrically connected to the gate terminal 1042 (e.g., through a conductive via that extends upwardly from the gate bus 1046) which is implemented as a gate bond pad, and the drain bus 1048 is electrically connected to the drain terminal 1044 (e.g., through a conductive via that extends upwardly from the drain bus 1048) which is implemented as a drain bond pad. The source fingers 1056 are electrically connected to the source terminal via a plurality of conductive source vias 1066 that extend through the semiconductor layer structure 1030. The conductive source vias 1066 may comprise metal-plated vias that extend completely through the semiconductor layer structure 1030.

Figure 8B:
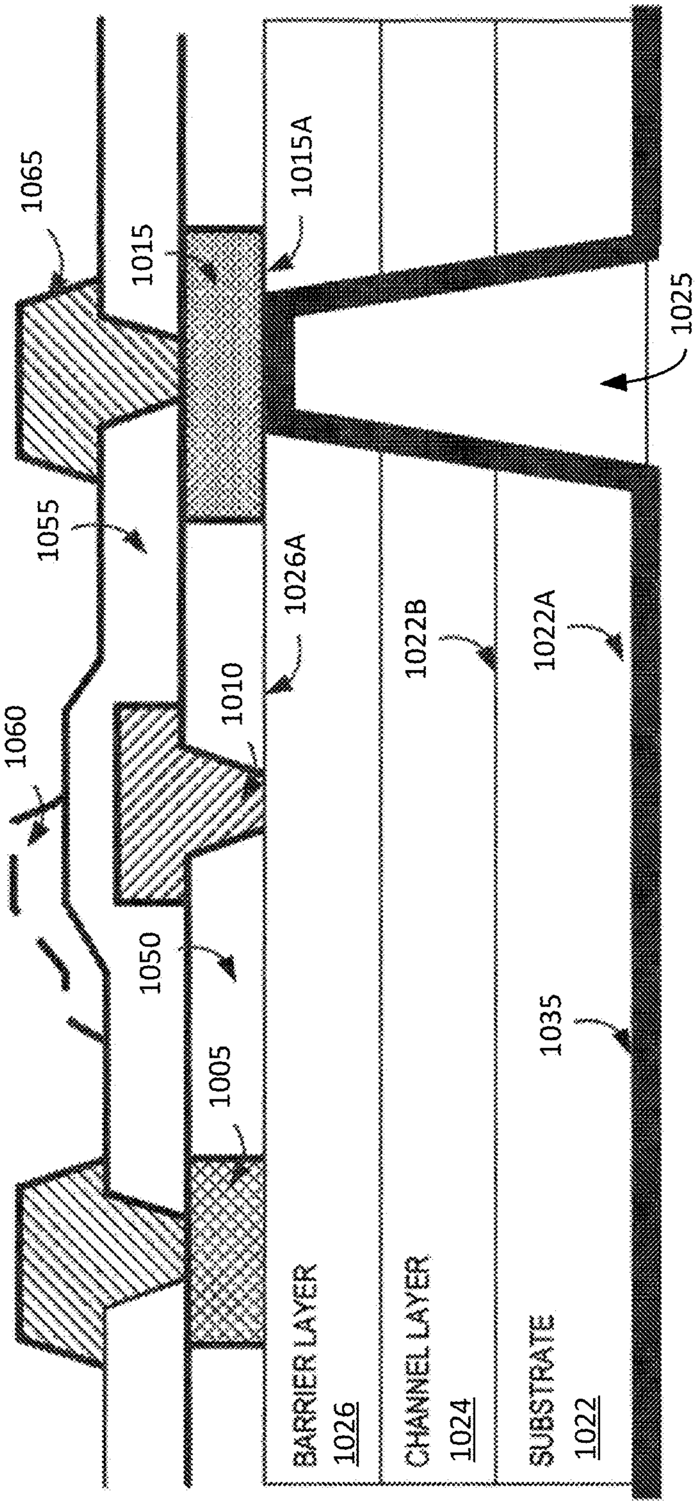
FIG. 8B is a schematic cross-sectional view of a HEMT device in accordance with some embodiments of the present disclosure.

FIG. 8B is a schematic cross-sectional view of a conventional HEMT device 1000. For example, FIG. 8B can be a cross section of FIG. 8A as outlined by the unit cell transistors 1016. A semiconductor structure 1022, such as a semiconductor structure for a Group III nitride semiconductor HEMT, may be formed on a wide-bandgap substrate 1022 such as a SiC substrate, a GaN substrate, etc. The substrate 1022 may be a semi-insulating SiC substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Wolfspeed, Inc. The term "semi-insulating" is used descriptively herein, rather than in an absolute sense.

In some embodiments, the substrate 1022 has a resistivity equal to or higher than about $1\times10^5$ ohm-cm at room temperature, such as silicon carbide (SIC). Exemplary SiC substrates that may be used in some embodiments of the present disclosure are manufactured by, for example, Wolfspeed, Inc., the assignee of the present invention. Methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although SiC can be used as a substrate material, embodiments of the present application may utilize any suitable substrate having a bandgap above about 2 eV. The substrate 1022 can be a SiC wafer, and the Doherty amplifier dies 200 (e.g., including HEMT devices) can be formed, at least in part, via wafer-level processing, and the wafer can then be diced to provide a plurality of individual Doherty amplifier die 200.

As shown in FIG. 8B, a channel layer 1024 is formed on an upper surface 1022B of the substrate 1022, and a barrier layer 1026 is formed on an upper surface of the channel layer 1024. The channel layer 1024 and the barrier layer 1026 can each be formed by epitaxial growth in some embodiments. Techniques for epitaxial grown of Group III nitrides have been described in, for example, U.S. Pat. Nos. 5,210,051, 5,393,993, and 5,523,589, the disclosures of which are also incorporated by reference herein in their entireties. The channel layer 1024 and the barrier layer 1026 can include Group III nitride-based materials.

While semiconductor structure 1090 is shown with channel layer 1024 and barrier layer 1026 for purposes of illustration, semiconductor structure 1090 can include additional layers/structures/elements such as a buffer and/or nucleation layer(s) between channel layer 1024 and substrate 1022, and/or a cap layer on barrier layer 1026. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface 1022B of the substrate 1022 to provide an appropriate crystal structure transition between the SiC substrate 1022 and the reminder of the HEMT device 1000. Additionally, strain balancing transition layer(s) can also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

A source contact 1015 and a drain contact 1005 can be formed on an upper surface 1026A of the barrier layer 1026 and can be laterally spaced apart from each other. A gate contact 1010 can be formed on the upper surface 1026A of the barrier layer 1026 between the source contact 1015 and the drain contact 1005. The material of the gate contact 1010 can be chosen based on the composition of the barrier layer 1026, and may, in some embodiments, be a Schottky contact.

The source contact 1015 can be coupled to a reference signal such as, for example, a ground voltage. The coupling to the reference signal can be provided by a via 1025 that extends from a lower surface 1022A of the substrate 1022, through the substrate 1022 to an upper surface 1026A of the barrier layer. The via 1025 can expose a bottom surface of the ohmic portion 1015A of the source contact 1015. A backmetal layer 1035 can be formed on the lower surface 1022A of the substrate 1022 and on the side walls of the via 1025. The backmetal layer 1035 can directly contact the ohmic portion 1015A of the source contact 1015. The backmetal layer 1035 and a signal coupled thereto can be electrically connected to the source contact 1015.

The HEMT device 1000 can include a first insulating layer 1050 and a second insulating layer 1055. The first insulating layer 1050 can directly contact the upper surface of the semiconductor structure 1090 (e.g., contact the upper surface 1026A of the barrier layer 1026). The second insulating layer 1055 can be formed on the first insulating layer 1050. It will also be appreciated that more than two insulating layers can be included in some embodiments. The first insulating layer 1050 and the second insulating layer 1055 can serve as passivation layers for the HEMT device 1000.

The source contact 1015, the drain contact 1005, and the gate contact 1010 can be formed in the first insulating layer 1050. In some embodiments, at least a portion of the gate contact 1010 can be on the first insulating layer. In some embodiments, the gate contact 1010 can be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 1055 can be formed on the first insulating layer 1050 and on portions of the drain contact 1005, gate contact 1010, and source contact 1015.

In some embodiments, field plates 1060 can be formed on the second insulating layer 1055. At least a portion of a field plate 1060 can be on the gate contact 1010. At least a portion of the field plate 1060 can be on a portion of the second insulating layer 1055 that is between the gate contact 1010 and the drain contact 1005. Field plates and techniques for forming field plates are discussed, by way of example, in U.S. Pat. No. 8,120,064, the disclosure of which is hereby incorporated herein in its entirety by reference.

Metal contacts 1065 can be disposed in the second insulating layer 1055. The metal contacts 1065 can provide interconnection between the drain contact 1005, gate contact 1010, and source contact 1015 and other parts of the HEMT device 1000. Respective ones of the metal contacts 1065 can directly contact respective ones of the drain contact 1005 and/or source contact 1015.

In some embodiments, the main and the at least one peak amplifiers are GaN-based HEMTs.

In some embodiments, the main and the at least one peak amplifiers are LDMOS transistors.

Figure 9A:
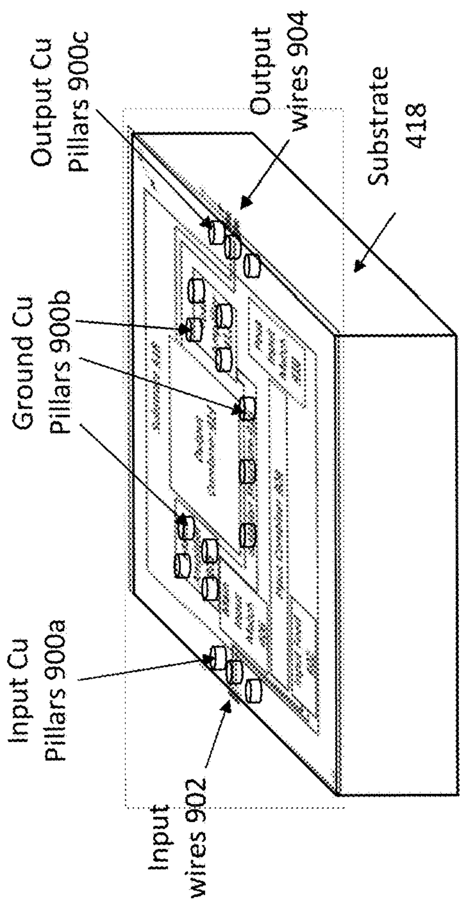
FIGS. 9A-9C are schematic illustrations of stages of an example packaged Doherty amplifier according to some embodiments.
Figure 9B:
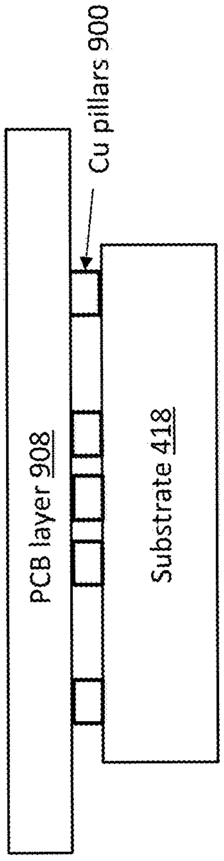
Figure 9C:
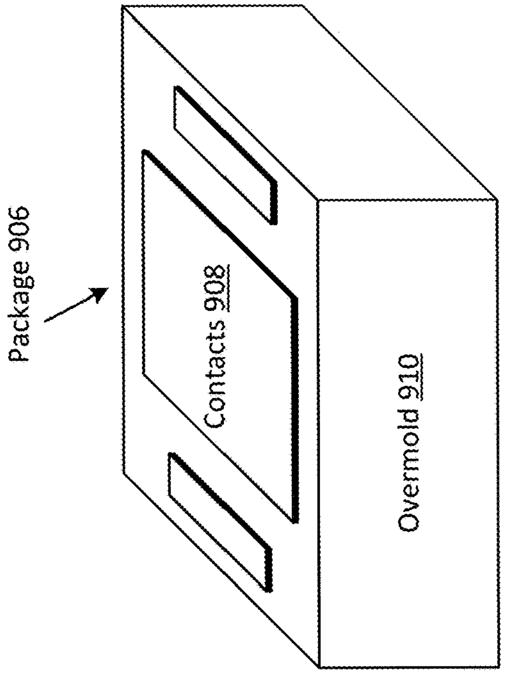

FIGS. 9A-9C are schematic illustrations of various stages of an example packaged Doherty amplifier according to some embodiments. FIG. 9C shows the completed package 906. FIGS. 9A and 9B show a first and second stage of a packaging process that results in package 906 of FIG. 9C.

More particularly, FIG. 9A shows a three-dimensional view of the Doherty amplifier die 200 of FIG. 4 with copper (Cu) pillars 900 attached. Input Cu pillars 900*a* are connected to one or more input wires 902 that may electrically connect to input feed 402 of Doherty amplifier die 200. Ground Cu pillars 900*b* are connected isolation structure 416, and to ground structures of main amplifier die 408 and peak amplifier die 412. Output Cu pillars 900*c* are connected to one or more output wires 904. While the example in FIG. 9A includes seventeen (17) Cu pillars, the present disclosure is not so limited and other embodiments include different quantities and/or material of the pillars 900 sufficient to electrically connect the Doherty amplifier die 200 to a printed circuit board (PCB), as shown in FIG. 9B for example.

FIG. 9B shows the Doherty amplifier die of FIG. 9A connected with the copper (Cu) pillars 900 to PCB layer 908. PCB layer 908 is configured to provide input and output connections to/from the package 906. As shown in FIG. 9C, the packaged Doherty amplifier 906 includes the Doherty amplifier die 200 connected to PCB layer 908. The packaged Doherty amplifier 906 also includes overmold 910 (e.g., a plastic overmold) that surrounds the Doherty amplifier die 200 connected to PCB layer 908 of FIG. 9B. Contacts 908 complete the package 906 and are attached to input/output electrical connections of PCB layer 908 (not shown).

Figure 10A:
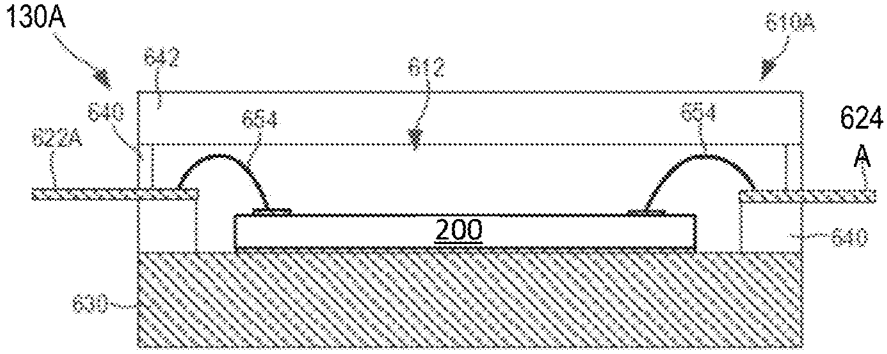
FIG. 10A is a schematic side view of a packaged MMIC Doherty amplifier according to some embodiments.

FIG. 10A is a schematic side view of a packaged MMIC amplifier 130A. As shown in FIG. 10A, packaged MMIC amplifier 130A includes a MMIC Doherty amplifier die 200 (including isolation structure 416) packaged in an open cavity package 610A. The package 130A includes metal gate leads 622A, metal drain leads 624A, a metal submount 630, sidewalls 640 and a lid 642.

The submount 630 may include materials configured to assist with the thermal management of the package 130A. For example, the submount 630 may include copper and/or molybdenum. In some embodiments, the submount 630 may be composed of multiple layers and/or contain conductive vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials.

In some embodiments, the sidewalls 640 and/or lid 642 may be formed of, for example, Al2O3. The lid 642 may be glued to the sidewalls 640 using an epoxy glue. The sidewalls 640 may be attached to the submount 630 conductive via, for example, braising. The gate lead 622A and the drain lead 624A may be configured to extend through the sidewalls 640, though embodiments of the present inventive concepts are not limited thereto.

The MMIC Doherty amplifier die 200 is mounted on the upper surface of the metal submount 630 in an air-filled cavity 612 defined by the metal submount 630, the ceramic sidewalls 640 and the ceramic lid 642. The gate and drain terminals of MMIC amplifier die 100 may be on the top side of the structure, while the source terminals are on the bottom side of the structure.

The gate lead 622A may be connected to the gate terminals of MMIC Doherty amplifier die 200 by one or more bond wires 654. Similarly, the drain leads 624A may be connected to the drain terminal of MMIC Doherty amplifier die 200 by one or more bond wires 654. The source terminals may be mounted on the metal submount 630 using, for example, a conductive die attach material (not shown). The metal submount 630 may provide the electrical connection to the source terminal 126 and may also serve as a heat dissipation structure that dissipates heat that is generated in the Doherty amplifier die 200.

The heat is primarily generated in the upper portion of the MMIC Doherty amplifier die 200 where relatively high current densities are generated in, for example, the channel regions of the unit cell transistors. This heat may be transferred though the source conductive vias 1025 and the semiconductor layer structure of the device to the source terminal and then to the metal submount 630.

Figure 10B:
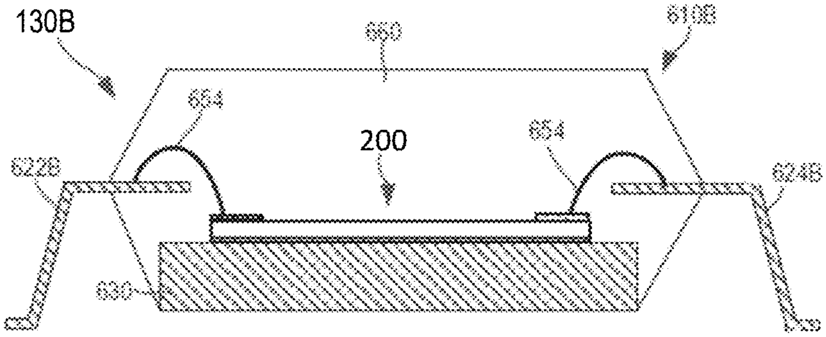
FIG. 10B is a schematic side view of another packaged MMIC Doherty amplifier according to some embodiments.

FIG. 10B is a schematic side view of another packaged MMIC Doherty amplifier 130B. The MMIC Doherty amplifier 130B differs from the MMIC Doherty amplifier 130A in that it includes a different package 610B. The packaged MMIC Doherty amplifier 130B includes a metal submount 630, as well as metal gate and drain leads 622B, 624B. The packaged MMIC Doherty amplifier 130B also includes a plastic overmold 660 that at least partially surrounds the Doherty amplifier die 200, the leads 622B, 624B, and the metal submount 630.

While embodiments discussed above are explained in the non-limiting context of a packaged MMIC Doherty amplifier that includes an isolation structure according to embodiments herein, the disclosure is not so limited. Instead, other packages may be used, including without limitation, an overmolded package.

Devices as described herein may be used as Doherty amplifiers of a small enough footprint to fit on PCM structures of transistor wafers (e.g., wafer 100) for on-wafer characterization to aid in wafer and/or lot correlation with linearized Doherty performance. Doherty amplifier incorporating transistor devices and isolation structures as described herein also can be used for low-power (e.g., 10-40 W) RF products such as multi-MIMO applications.

Moreover, copper (Cu) pillars or solder balls/bumps can be applied on an upper surface of the Doherty amplifier die 200 for flip-chip applications at low-power levels (e.g., about 10-40 W). For example, some embodiments are directed to a Doherty amplifier device including a substrate having a bandgap of above about 2 eV. The substrate has a first surface and a second surface. The Doherty amplifier device further includes a main amplifier on the first surface of the substrate; at least one peak amplifier on the first surface of the substrate; an input network on the first surface of the substrate connected to a first input of the main amplifier and to a second input of the at least one peak amplifier; an output combiner on the first surface of the substrate connected to a first output of the main amplifier and to a second output of the at least one peak amplifier; and an isolation structure arranged on one or more vias that extend into the first surface of the substrate between the input network and the output combiner. The isolation structure is configured to isolate the input network and the output combiner. The Doherty amplifier device further includes a printed circuit board; and one or more conductive pillar structures that protrude from the first surface of the substrate and are electrically connected to the one or more conductive vias and the printed circuit board.

Although embodiments of the inventive concepts have been described in considerable detail with reference to certain configurations thereof, other versions are possible. The Doherty amplifier die can also have many different shapes. Accordingly, the spirit and scope of the invention should not be limited to the specific embodiments described above.

What is claimed is:

1. A Doherty amplifier die comprising:
- a substrate having a bandgap of above about 2 eV;
- a main amplifier on the substrate;
- at least one peak amplifier on the substrate;
- an input network on the substrate connected to a first input of the main amplifier and to a second input of the at least one peak amplifier, the input network comprising at least an input feed, an input combiner, and an input match network;
- an output combiner on the substrate connected to a first output of the main amplifier and to a second output of the at least one peak amplifier; and
- a radio frequency isolation structure arranged on the substrate between the input network and the output combiner,
- and the radio frequency isolation structure is configured to isolate the input network and the output combiner.

2. The Doherty amplifier die of claim 1, wherein the radio frequency isolation structure comprises a transmission line on the substrate.

3. The Doherty amplifier die of claim 1, wherein the radio frequency isolation structure comprises a continuous segment of a metal layer on the substrate.

4. The Doherty amplifier die of claim 1, wherein the radio frequency isolation structure comprises a discontinuous segment of a metal layer on the substrate.

5. The Doherty amplifier die of claim 1, wherein the substrate comprises a first surface and a second surface opposite the first surface, and wherein the radio frequency isolation structure comprises a U-shaped metal isolation structure on the first surface of the substrate.

6. The Doherty amplifier die of claim 1, wherein the radio frequency isolation structure comprises an upper surface and a lower surface, the Doherty amplifier die further comprising:
- a first via connected between a first portion of the lower surface of the radio frequency isolation structure and a source ground of the main amplifier; and
- a second via connected between a second portion of the lower surface of the radio frequency isolation structure and a source ground of the at least one peak amplifier.

7. The Doherty amplifier die of claim 6, further comprising:
- a plurality of additional vias between the first via and the second via, wherein respective vias are spaced apart and connected between a plurality of additional portions of the lower surface of the radio frequency isolation structure and a ground structure connected to the source ground of the main and peak amplifiers.

8. The Doherty amplifier die of claim 1, wherein the radio frequency isolation structure comprises an upper surface and a lower surface, the Doherty amplifier die further comprising:
- a via connected along a length of the lower surface of the radio frequency isolation structure and a source ground of the main amplifier and the peak amplifier.

9. The Doherty amplifier die of claim 1, wherein the input network comprises a main input match network for the main amplifier and a peak input match network for the peak amplifier, and an input combiner.

10. The Doherty amplifier die of claim 1, wherein the main and the at least one peak amplifiers are GaN-based High Electron Mobility Transistors, HEMTs.

11. The Doherty amplifier die of claim 1, wherein the main and the at least one peak amplifiers are laterally diffused metal oxide semiconductor, LDMOS, transistors.

12. A Doherty amplifier die comprising:
- a substrate having a bandgap of above about 2 eV;
- a main amplifier on the substrate;
- at least one peak amplifier on the substrate;
- an input network on the substrate comprising (i) an input match network and (ii) an input combiner comprising a plurality of components, the input network connected to a first input of the main amplifier and to a second input of the at least one peak amplifier;
- an output combiner on the substrate connected to a first output of the main amplifier and to a second output of the at least one peak amplifier; and
- a radio frequency isolation structure arranged on the substrate between the input network and the output combiner,
- and the radio frequency isolation structure is configured to isolate the input network and the output combiner.

13. The Doherty amplifier die of claim 12 wherein the radio frequency isolation structure comprises a transmission line on the substrate.

14. The Doherty amplifier die of claim 12, wherein the radio frequency isolation structure comprises a continuous segment of a metal layer of the substrate.

15. The Doherty amplifier die of claim 12, wherein the radio frequency isolation structure comprises a discontinuous segment of a metal layer on the substrate.

16. The Doherty amplifier die of claim 12, wherein the substrate comprises a first surface and a second surface opposite the first surface, and wherein the radio frequency isolation structure comprises a U-shaped metal isolation structure on the first surface of the substrate.

17. The Doherty amplifier die of claim 12, wherein the radio frequency isolation structure comprises an upper surface and a lower surface, the Doherty amplifier die further comprising:
- a first via connected between a first portion of the lower surface of the radio frequency isolation structure and a source ground of the main amplifier; and a second via connected between a second portion of the lower surface of the radio frequency isolation structure and a source ground of the at least one peak amplifier.

18. The Doherty amplifier die of claim 17, further comprising:

a plurality of additional vias between the first via and the second via, wherein respective vias are spaced apart and connected between a plurality of additional portions of the lower surface of the radio frequency isolation structure and a ground structure connected to the source ground of the main and peak amplifiers.

19. The Doherty amplifier die of claim 12, wherein the radio frequency isolation structure comprises an upper surface and a lower surface, the Doherty amplifier die further comprising:

a via connected along the length of the lower surface of the radio frequency isolation structure and a source ground of the main amplifier and the peak amplifier.

20. The Doherty amplifier die of claim 12, wherein the plurality of components of the input combiner comprise a first shunt capacitor, a series capacitor, a series inductor, and a second shunt capacitor.

21. The Doherty amplifier die of claim 12, wherein the plurality of components of the input combiner comprise a first shunt capacitor, a first series capacitor, a first series inductor, a second shunt capacitor, and a second series inductor.

22. The Doherty amplifier die of claim 12, wherein the plurality of components of the input combiner comprise a first shunt capacitor, a first series inductor, a second series capacitor, a second series inductor, and a second shunt capacitor.

23. The Doherty amplifier die of claim 12, wherein the main and the at least one peak amplifiers are GaN-based High Electron Mobility Transistors, HEMTs.

24. The Doherty amplifier die of claim 12, wherein the main and the at least one peak amplifiers are laterally diffused metal oxide semiconductor, LDMOS, transistors.

25. A Doherty amplifier device comprising:

a substrate having a bandgap of above about 2 eV, the substrate having a first surface and a second surface;

a main amplifier on the first surface of the substrate;

at least one peak amplifier on the first surface of the substrate;

an input network on the first surface of the substrate connected to a first input of the main amplifier and to a second input of the at least one peak amplifier, the input network comprising at least an input feed, an input combiner, and an input match network;

an output combiner on the first surface of the substrate connected to a first output of the main amplifier and to a second output of the at least one peak amplifier;

a radio frequency isolation structure arranged on one or more vias that extend into the first surface of the substrate between the input network and the output combiner, the radio frequency isolation structure configured to isolate the input network and the output combiner;

a printed circuit board; and one or more conductive pillar structures that protrude from the first surface of the substrate and are electrically connected to the one or more conductive vias and the printed circuit board.

* * * * *